United States Patent [19]

Miyazaki et al.

[11] Patent Number: 5,276,672
[45] Date of Patent: Jan. 4, 1994

[54] MICRO-DISPLACEMENT TYPE INFORMATION DETECTION PROBE DEVICE AND SCANNING TUNNELING MICROSCOPE, ATOMIC FORCE MICROSCOPE, INFORMATION PROCESSING DEVICE BY USE THEREOF

[75] Inventors: Toshihiko Miyazaki, Hiratsuka; Hiroyasu Nose, Zama; Ryo Kuroda, Machida; Toshimitsu Kawase, Atsugi; Katsuhiko Shinjo, Isehara, all of Japan

[73] Assignee: Canon Kabushiki Kaisha, Tokyo, Japan

[21] Appl. No.: 744,521

[22] Filed: Aug. 13, 1991

[30] Foreign Application Priority Data

Aug. 16, 1990 [JP] Japan ................ 2-215021
Jun. 5, 1991 [JP] Japan ................ 3-159852

[51] Int. Cl.$^5$ ............................................. G11B 9/00
[52] U.S. Cl. ...................... 369/126; 250/306; 73/105; 310/367; 310/331; 310/332
[58] Field of Search ............. 250/306, 442.11; 369/126; 73/105; 310/367, 368, 330, 331, 332

[56] References Cited

U.S. PATENT DOCUMENTS

| | | | |
|---|---|---|---|
| 4,112,279 | 9/1978 | Brohard | 310/332 |
| 4,343,993 | 8/1982 | Binnig et al. | 250/306 |
| 4,520,570 | 6/1985 | Bednorz et al. | 33/180 R |
| 4,668,865 | 5/1987 | Gimzewski et al. | 250/306 |
| 4,724,318 | 2/1988 | Binnig | 250/306 |
| 4,831,614 | 5/1989 | Duerig et al. | 250/306 |
| 4,912,822 | 4/1990 | Zdeblick et al. | 250/442.11 |
| 5,107,114 | 4/1992 | Nishioka et al. | 73/105 |

FOREIGN PATENT DOCUMENTS

| | | |
|---|---|---|
| 0163171 | 12/1985 | European Pat. Off. . |
| 0197663 | 10/1986 | European Pat. Off. . |
| 58-58780 | 4/1983 | Japan .................. 310/331 |
| 59-177979 | 10/1984 | Japan .................. 310/332 |
| 62-281138 | 12/1987 | Japan . |
| 1093922 | 5/1984 | U.S.S.R. . |
| 1523364 | 8/1978 | United Kingdom . |
| 2182480 | 5/1987 | United Kingdom . |

OTHER PUBLICATIONS

Binning, et al., "Surface Studies by Scanning Tunneling Microscopy," Physical Review Letters, vol. 49, No. 1, pp. 57–60 (Jul. 5, 1982).

Binning, et al., "Atomic Force Microscope," Physical Review Letters, vol. 56, No. 9, pp. 930–933 (Mar. 3, 1986).

*Primary Examiner*—Jack I. Berman
*Attorney, Agent, or Firm*—Fitzpatrick, Cella, Harper & Scinto

[57] ABSTRACT

A micro-displacement type information detection probe device capable of following all of the undulation on the μm order, and the periodical surface unevenness on the nm order, of the recording medium or the substrate in performing recording and/or reproduction, by use of, for example, tunnel current, is provided. By forming a cantilever of the first stage by extending the insulation layer laminated on the substrate, providing a lalyer structure having a piezoelectric material sandwiched between the electrode members on the cantilever of the first stage, forming further a cantilever of the second stage on the extension from the tip end of the first cantilever having said layer structure and also forming an information detection probe at the free end of the cantilever of said second stage, and utilizing the reverse piezoelectric effect formed by application of a voltage between the electrodes of said layer structure, the cantilever of the above first stage is displaced.

6 Claims, 6 Drawing Sheets

MICRO-DISPLACEMENT TYPE INFORMATION DETECTION PROBE DEVICE AND SCANNING TUNNELING MICROSCOPE, ATOMIC FORCE MICROSCOPE, INFORMATION PROCESSING DEVICE BY USE THEREOF

BACKGROUND OF THE INVENTION

1. Field of the Invention

This invention relates to a micro-displacement type information detection probe device utilizing the reverse piezoelectric effect for positional determination of a probe for the scanning tunneling microscopy, etc., and a scanning tunneling microscope, an atomic force microscope and an information processing device having such a device mounted therein.

2. Related Background Art

In recent years, the recording capacity of data in recording devices tends to become increasingly larger. In this tendency, it is essentially required that the size of the recording unit should become increasingly smaller and its density still higher. For example, in a digital audio disc for optical recording the size of the recording unit approaches even to about 1 $\mu m^2$.

On the other hand, recently, scanning tunneling microscopy (hereinafter abbreviated as STM) by which the electron structures of the surface of substance and the vicinity thereof can be directly observed has been developed [G. Binnig et al., Phys. Rev. Lett. 49, 57 (1982)], whereby it has become possible to measure real space images with high resolving power, irrespectively of whether the substance may be either single-crystalline or amorphous. Moreover, since it has the advantage that observation can be made at low power without giving any damage by current to the medium, and further since it can be actuated not only in a super-high vacuum but also in air or in solution and used for various materials, a wide scope of applications has been expected.

The STM utilizes the phenomenon that when a probe of a metal (probe electrode) and an electroconductive substance are approached to a distance of about 1 nm (10 Å) with application of a voltage therebetween, a current will flow between them. The current is very sensitive to the distance change between them, and the surface information of the real space can be obtained by scanning the probe so as to keep the current or the average distance between them at a constant level. In this case, the resolving power in the intraplanar direction is 1 Å or more.

By applying the principle of STM and using a material having a memory effect for switching characteristics of voltage and current as the recording medium, such as thin film of $\pi$-electron type organic compounds, chalcogenides, etc., information recording with a recording unit of 0.001 $\mu m^2$ or less is possible.

On the other hand, atomic force microscopy (hereinafter abbreviated as AFM) observes the three-dimensional shape of a surface with a resolving power of nanometer or less by detecting conversely the force from the warping amount of a cantilever (elastic member) supporting a probe approaching a distance of 1 nanometer or less to the sample surface by receiving the force acting between the sample and the probe, and scanning the probe on the sample surface while controlling the distance between the sample and the probe so as to make the force constant [Binnig et al, Phys. Rev. Lett. 56 930 (1986)]. In such AFM, the sample is not required to have electroconductivity as in scanning tunneling microscopy (STM), and insulating materials, particularly semiconductor resist surface or biological polymer, etc. can be observed on atomic-molecular order, and therefore wide applications have been expected.

Also, for performing recording and reproduction of high density by use of the above recording medium, a large number of devices have been proposed. For example, in a device disclosed in Japanese Laid-open Patent Application No. 62-281138, a converter, a probe for performing recording and reproduction of information and a probe driven mechanism for controlling the distance between the recording medium and the probe are integrally formed on a silicon chip by use of the photolithographic technique to effect integration of the recording head.

Thus, when the integrated recording head is set in a recording and reproduction device of high density, since the recording area occupied by one recording head is on the $\mu m$ order, it has been required that hundreds to thousands of recording heads should be prepared, and further arranged to the form capable of relative movement on the order of mm between the recording medium and plural recording heads, thereby enhancing recording capacity or recording speed.

However, when hundreds to thousands of recording heads are prepared and placed in the vicinity of the recording medium, and the recording medium and the recording head are relatively moved on the order of the mm, the following problems will ensue:

1) The distance between the recording medium and the recording probe set at the tip end of recording head is as short as several nm. In order for the recording head to follow the recording medium under this state, since the deviation amount of the recording head is about 1 $\mu m$, the undulation or slope of the recording medium and the substrate must be suppressed within about 1 $\mu m$.

2) The recording medium and the substrate have also an unevenness of nm period formed during preparation of the recording bit or the substrate, in addition to large undulations of several $\mu m$ period. When such recording medium and recording head are relatively moved by several mm, the recording head is required to follow both the unevenness of nm period and undulation of $\mu m$ period. Therefore, if it is intended to follow the unevenness of nm period under the state where the undulation of $\mu m$ period can be followed, it is difficult to increase the device speed in relationship with the resonance frequency.

SUMMARY OF THE INVENTION

Thus, an object of the present invention is:

1) to provide a micro-displacement type information detection probe device which can follow all of the undulations on the $\mu m$ order, etc. and the periodical surface unevenness on the nm order of the recording medium or the substrate, and another object is:

2) to provide a scanning tunneling microscope, an atomic force microscope, and further an information processing device which performs recording, reproduction, etc., which have enabled improvement and stabilization of access speed, etc. by use of such a micro-displacement type information detection probe device.

The present invention provides a micro-displacement type information detection device, comprising a first cantilever formed with an insulation layer laminated on a substrate, a layer structure having a piezoelectric material sandwiched between electrodes provided on said cantilever, a second cantilever within said first cantilever provided with said layer structure, and a probe provided at the free end of said second cantilever, said device displacing said first and/or second cantilever by utilizing the reverse piezoelectric effect created by application of a voltage between the electrodes of said layer structure.

Also, the present invention provides a micro-displacement type information detection device, comprising a first cantilever formed with an insulation layer laminated on a substrate, a layer structure having a piezoelectric material sandwiched between electrodes provided on said cantilever, a second cantilever connected on the extension of the free end of said first cantilever, and a probe located at the free end of said second cantilever, said device displacing said first and second cantilever by utilizing the reverse piezoelectric effect created by application of a voltage between the electrodes of said layer structure.

Further, the present invention provides a micro-displacement type information detection device, comprising a first cantilever formed with an insulation layer laminated on a substrate, a layer structure having a piezoelectric material sandwiched between electrodes provided on said cantilever, a second cantilever sectionalized with a slit within said first cantilever having the structure with its free end being in the direction opposite to that of said first cantilever, a third cantilever sectionalized with a slit within said second cantilever with its free end being in the direction opposite to that of said second cantilever and a probe at its free end, said device displacing said first, second and third cantilevers by utilizing the reverse piezoelectric effect created by application of a voltage between the electrodes of said layer structure.

Further, the present invention provides a scanning tunneling microscope, an atomic force microscope and an information processing device equipped with the above micro-displacement type information detection device.

Thus, the basic constitution of the present invention is to form a plate-shaped cantilever with one end fixed on the substrate, make a structure having as alternately laminated a conductive electrode material and a piezoelectric material which gives rise to the reverse piezoelectric effect, and also form a micro-cantilever further at the second stage within the cantilever plane or on the extension from the tip of the cantilever, and provide an information detection probe at the free end of the micro-cantilever, and in such constitution, the following actions can be obtained by application of a voltage between the electrode members.

When an electrical field E is applied externally on the piezoelectric material, polarization P occurs in the piezoelectric crystal, which crystal gives rise to fine distortion proportional to the polarization P. In conventional dielectric material, the polarization P is in proportion to the electrical field E and hence the distortion is in proportion to E.

By utilizing such property, by giving electrical fields which are made partially different to, for example, piezoelectric materials provided in the shape of plates, warping shaped in an entire plate can be caused to occur.

Further, by forming a cantilever at the plural number of stages within the plane of the cantilever or on the extension from the tip end of the cantilever, and also making the constitution of at least the first stage cantilever so as to obtain warping due to the above reverse piezoelectric effect, when warping is caused to occur in all the cantilevers, the warping amount equal to the total sum of the respective warping amounts can be obtained between the outermost cantilever and the innermost cantilever.

Therefore, for example, when the distance between the recording medium and the probe is controlled, by assembling the constitution for effecting such action, it becomes possible to follow the respective unevenness on the nm order and the undulation on the $\mu$m order possessed by the recording medium and the substrate.

DETAILED DESCRIPTION OF THE PREFERRED EMBODIMENTS

Embodiment 1

Figure 1:
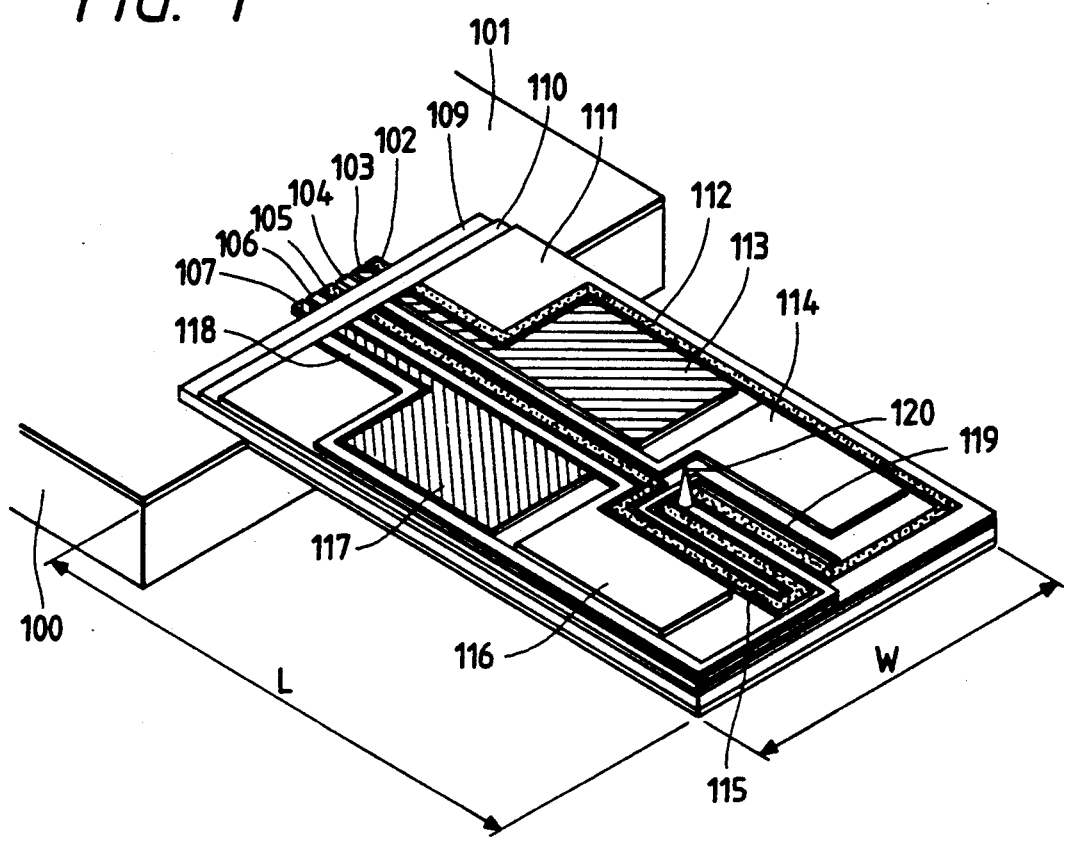
FIG. 1 is a stereoscopic perspective view of the micro-displacement type information detection probe device according to the first embodiment of the present invention.
Figure 2A:
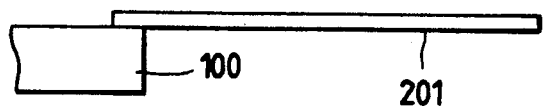
FIGS. 2A and 2B show the displacement state of the cantilever of the device according to FIG. 1.
Figure 2B:
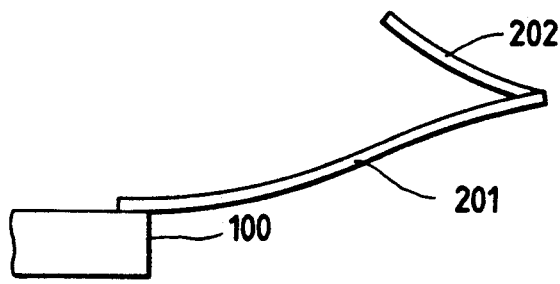

FIG. 1 and FIGS. 2A and 2B are a constitutional view and schematic views for illustration of the first embodiment of the present invention. In FIG. 1, 100 is a substrate, 101 an insulating layer such as $SiO_2$ or $Si_3N_4$ for forming a cantilever, 102–107, 112–118 are electrodes by use of such material as Au, Al, etc. for driving three-dimensionally the cantilever, 109, 111 are piezoelectric materials such as PZT, ZnO, AlN, etc. for effecting micro-displacement by giving electrical signals, 120 an information detection probe for detecting current or force such as tunnel current, atomic force, magnetic force, etc., and 119 a flexural slit for forming a micro-cantilever of the opposite direction.

FIG. 2A shows the initial state of the cantilever 201 and FIG. 2B the state when the micro-cantilever 202 of the opposite direction to the cantilever 201 is displaced by the reverse piezoelectric effect.

The micro-displacement type information detection probe device having the constitution as described above is described in more detail by referring to FIG. 1 and FIGS. 2A and 2B.

First, the preparation steps of the micro-displacement type information detection probe device are shown below. On a Si (100) substrate 100 with a thickness of 0.5 mm, an $Si_3N_4$ film was formed to a thickness of 0.15 μm according to the CVD method to form an insulating layer 101. The starting gases employed were $SiH_2Cl_2:NH_3$ (1:9), and the substrate temperature was 800° C. Next, by use of the photolithographic technique and dry etching using $CF_4$ gas, the $Si_3N_4$ film 102 was subjected to patterning into the shapes of a desired cantilever as shown in FIG. 1 and a micro-cantilever of the opposite direction formed with the flexural slit 119. Subsequently, as the material for the electrodes 102-107, Au film was formed to 0.1 μm at the cantilever portion of the insulating layer 101 by use of the sputtering method, and subjected to patterning into a desired shaped by use of the photolithographic technique. The patterning shape in this case is the same as the electrodes 112-117 shown on the upper surface in FIG. 1. For improvement of adhesion between $Si_3N_4$ and Au, Cr film may be also formed. Next, as the piezoelectric material 109, AlN film was formed to 0.3 μm, according to the sputtering method. By use of Al for the target, sputtering was effected in $Ar+N_2$ atmosphere. Further, patterning was carried out by photolithography and wet etching with an etchant for Al. Then, the above steps were repeated to form alternately the piezoelectric material and the electrode to form a bimorph structure of Si substrate-$Si_3N_4$-Au-AlN-Au-AlN-Au as shown in FIG. 1. Finally, as the material for the information detection probe 120, W was deposited in a cone shape according to the vapor deposition method.

The size of the micro-displacement type information detection probe prepared according to the above preparation steps was 150 μm in width W and 600 μm in length L. The size of the micro-cantilever of the opposite direction formed inside of the flexural slit 119 was 50 μm in width and 300 μm in length.

As described above, the patterns of the electrodes are respectively the same for the electrodes of 112, 113, 114, 115, 116, 117 and the electrodes for 102, 103, 104, 105, 106, 107 correspondingly, and 110 which is the intermediate electrode is formed on the whole surface of the cantilever.

Next, the driving method of the micro-displacement type information detection probe device shown in FIG. 1 is described. First, when no voltage is swept on the AlN piezoelectric devices 109, 111, it is in the form as shown in FIG. 2A. Next, with the Au electrode 100 as the ground, a minus bias is swept on the upper electrodes of 113, 117, a plus bias swept on the lower electrodes of 103, 107, a minus bias swept on the lower electrodes 104, 106, a plus bias swept on the upper electrodes of 114, 116, a plus bias swept on the lower electrodes of 102, 105, and a minus bias swept on the upper electrodes of 112, 115. By stretching the AlN piezoelectric devices 109, 111 utilizing the reverse piezoelectric effect created by such sweep, a warping displacement as shown in FIG. 2B can be obtained.

Therefore, by use of the micro-displacement type information detection probe device of the present invention, even if the dimensions may be the same as those of the cantilever of the prior art, it has become possible to obtain a displacement amount of about 1.5-fold to 2-fold as compared with the prior art. The size and the shape of the flexural slit 119 shown in the present embodiment are not required to be limited to those of the present embodiment, but it can have various shapes. For example, the flexural slit may also have a mountain-like shape.

Embodiment 2

Figure 3:
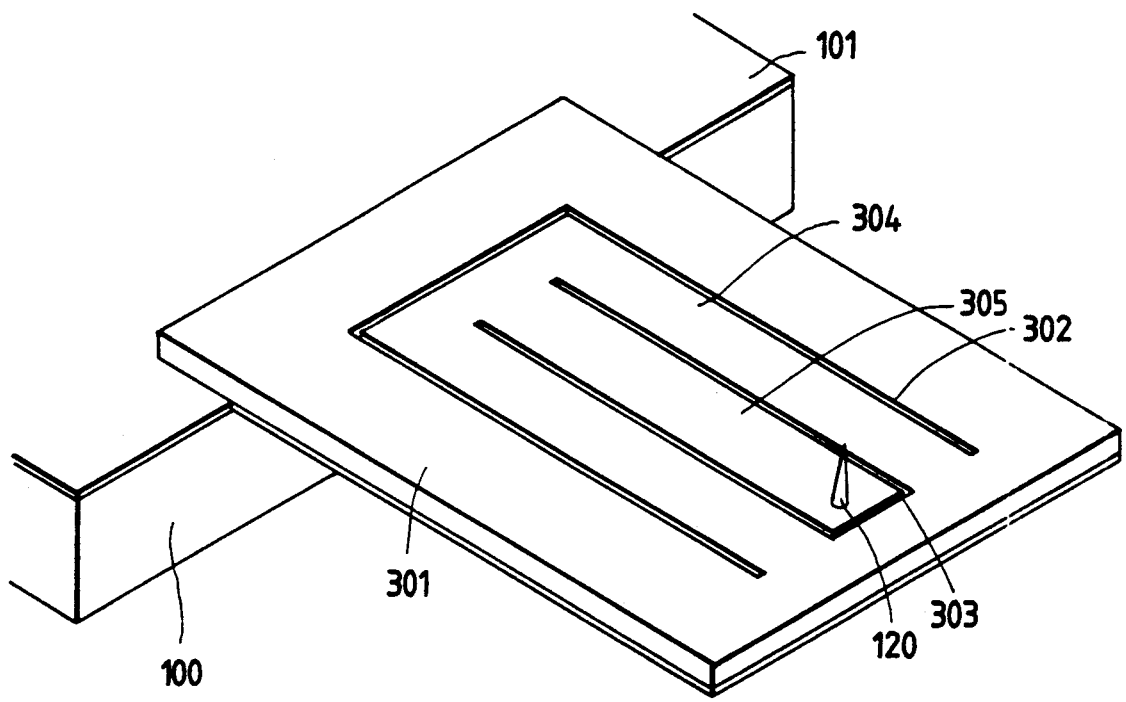
FIG. 3 is a stereoscopic perspective view of the micro-displacement type information detection probe device according to the second embodiment of the present invention.
Figure 4A:
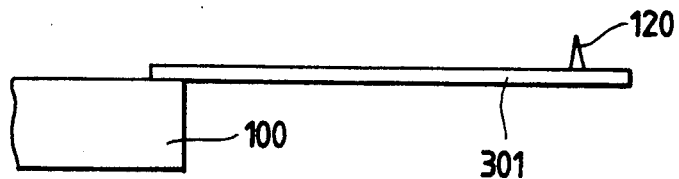
FIGS. 4A and 4B show the displacement state of the cantilever of the device according to FIG. 3.
Figure 4B:
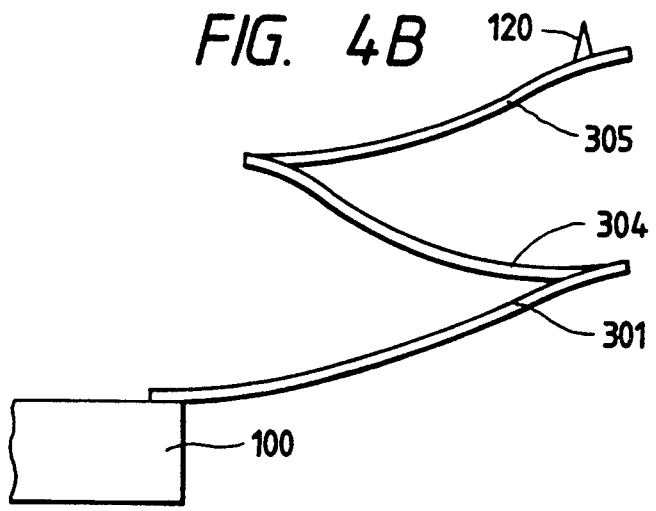

FIG. 3 and FIGS. 4A and 4B show the second embodiment. In FIG. 3, 100 is a substrate, 101 an insulating layer, 301 a cantilever, 302, 303 are flexural slits, 304 is a first micro-cantilever of the opposite direction, and 305 a second micro-cantilever formed inside of the first micro-cantilever of the opposite direction.

Although not shown in FIG. 3, an insulating material, a piezoelectric material and an electrode material with the same film structures as in FIG. 1 are formed on the Si substrate 100 as the bimorph structure of $Si_3N_4$-Au-AlN-Au-AlN-Au. FIGS. 4A and 4B are schematic views showing the states before and after the displacement of FIG. 3.

The Au electrode not shown in FIG. 3 is given a bias voltage according to the same method as in the driving method described in Example 1 to displace the AlN piezoelectric material not shown, thereby having the cantilevers of 301, 304, 305 warped. As the result, as shown in FIG. 4B, by use of the device of the present invention having the same dimensions as the cantilever of the prior art, a 2- to 3-fold displacement amount could be obtained.

As described above, by constituting the cantilevers in multiple stages, the displacement amount could be taken further than in Embodiment 1.

In the above embodiments, description has been made about the embodiment provided with only one cantilever 305, but a plurality of cantilevers 305 may be also juxtaposed and implemented in the same manner as described above.

Embodiment 3

Figure 5:
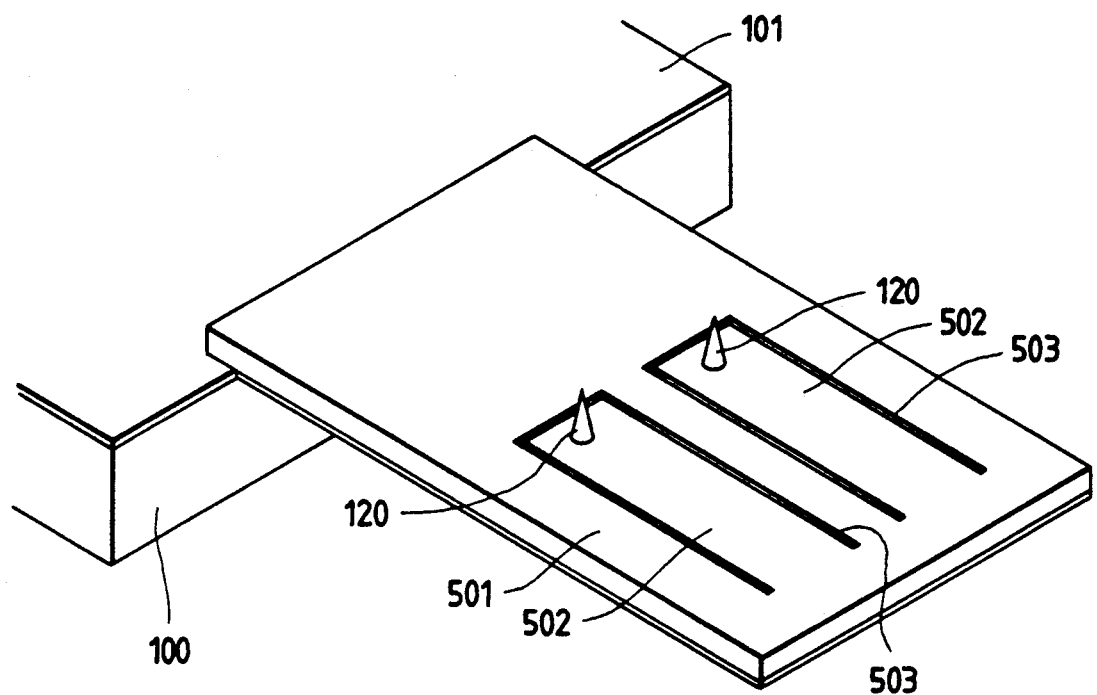
FIG. 5 is a stereoscopic perspective view of the micro-displacement type information detection probe device according to the third embodiment of the present invention.

FIG. 5 shows the third embodiment.

In FIG. 5, 100 is a substrate, 101 an insulation layer, 501 a cantilever, and 502 a micro-cantilever of the opposite direction formed by providing two slits 503 in parallel on the cantilever 501. 120 is an information detection probe. By making such constitution, it becomes possible to have either one of the micro-cantilevers having the information detection probe stand by as the spare cantilever, and even if one of them may be broken under some influence, it has become possible to be repaired immediately.

In the present embodiment, the parallel slits were made to form two systems, but they are not limited to two and may be also arranged for more than two systems.

Embodiment 4

Figure 6:
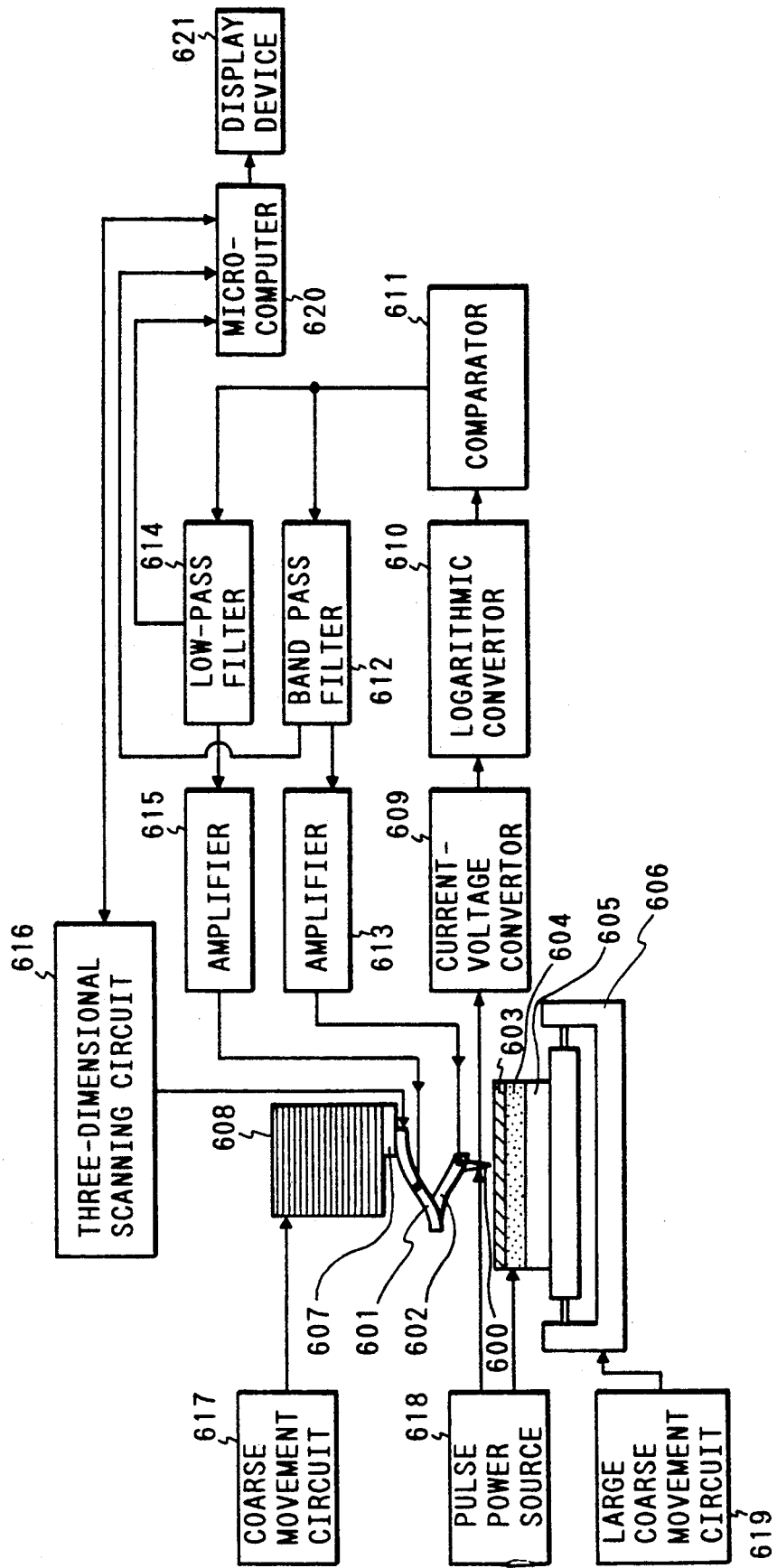
FIG. 6 is a block diagram showing the information processing device having the micro-displacement type information detection probe device mounted therein.

FIG. 6 shows the fourth embodiment.

Here is shown an embodiment in which the micro-displacement type information detection probe device is mounted in an information processing device capable of recording and reproduction. In FIG. 6, 600 is a probe for recording and reproducing information, 601 a cantilever, 602 a micro-cantilever provided on the cantilever 601, 603 a recording layer built up to 8 layers of squarylium-bis-6-octylazulene having the memory effect for the switching characteristics of voltage-current by use of the LB method on a graphite substrate. 604 an electrode, 605 a substrate, 606 an XY stage, 607 a substrate, 608 a longitudinal direction (Z-axis direction)

positional control means, 609 a current voltage converting circuit for converting tunnel current flowing between the probe 600 and the recording layer 603 to voltage, 610 a logarithmic convertor, 611 a comparator, 612 a band pass filter for taking out signals only of specific frequency components, 613 an amplifier, 614 a low pass filter for taking out signals of predetermined low frequency, 615 an amplifier, 616 a three-dimensional scanning circuit for driving three dimensionally the cantilever 601 and the micro-cantilever 602, 617 a driving circuit for driving the longitudinal direction position control means 608, 618 a pulse power source for recording and reproducing information to the recording layer 603, and 619 a large coarse movement circuit for driving the XY stage 606.

Next, with the constitution of the devices and media as described above, the recording and reproducing device of high density is actuated in the air. For controlling the distance between the probe 600 and the recording layer 603 to a constant state of several nm (nanometers), the electrical feedback signal passing through the current-voltage converting circuit 609, the logarithmic converting circuit 610, the comparator 611, the band pass filter 612, the low pass filter 614, the amplifiers 613, 615 is given to the cantilever 601 and the micro-cantilever 602. As the positional detection means between the probe 600 and the recording layer 603, tunnel current was utilized. Under the state as described above, recording and reproduction can be performed. Recording is performed by moving the three-dimensional scanning circuit 616 to any desired place by use of the XY stage 606, the large coarse movement circuit 619 and applying a voltage of 2 V exceeding 1.5 V which is the threshold value voltage causing the electrical memory effect to occur between the probe 600 and the recording layer 603, and a pulse width of 1 $\mu$sec, by use of the pulse power source 618. As the result, the electrically ON stage (the state in which current flows by 3 ciphers or more as compared with the OFF stage) could be written in the recording layer 603. It was possible to trace the recording position and reproduce the ON state.

In the above embodiment, there is shown an example in which one having squarylium-bis-6-octylazulene built up to 8 layers on a graphite substrate by use of the LB method is used as the recording medium, but as the material for the recording medium (recording layer), any material which can perform writing and erasing may be employed, and as the preparation method of the medium, it is not required to be limited to this method at all.

In carrying out recording and reproduction as mentioned above, the XY stage is moved on the mm order, and in such case, there is possibility that the probe 600 may contact through the respective inherent unevenness and undulation of the recording layer 603, the electrode 604 and the substrate 605, and therefore the contact must be avoided by sending an electrical feedback signal to the cantilever 601 or the micro-cantilever 602.

The electrical feedback signal at this time is formed by dividing the signal from the comparator 611 into two signals so as to follow the large undulation with some 10 Hz frequency possessed by the substrate 605 and the unevenness of some 100 Hz possessed by the electrode 604, and the signal with some 10 Hz frequency is sent through the low pass filter 614 to the cantilever 601, while the signal with some 100 Hz frequency sent through the band pass filter 612 to the micro-cantilever 602.

Thus, by separating the signal to actuate independently the cantilever 601 and the micro-cantilever 602, high speed scanning becomes possible, whereby the access speed of the information processing device of the present embodiment could be improved.

As is common to the embodiments 1–4 as described above, since $Si_3N_4$ for forming the insulation layer 101, AlN which is the piezoelectric material and Au which is the electrode material have linear expansion coefficients and Young's moduli which are different from one another, and therefore when the cantilever is formed by layer structure formation of these, warping of the cantilever may sometimes occur depending on temperature change. Therefore, it is preferable to choose suitably the dimensions (length, etc.) of the cantilever and the micro-cantilever so that the probe may come to the adequate position in view of also such thermal expansion or shrinkage.

Embodiment 5

Figure 7A:
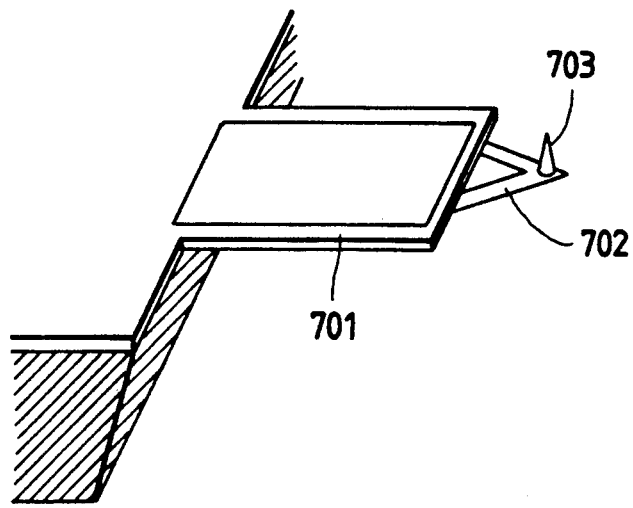
FIGS. 7A and 7B are a stereoscopic perspective view and a sectional view of the micro-displacement type information detection probe device according to the fifth embodiment of the present invention.
Figure 7B:
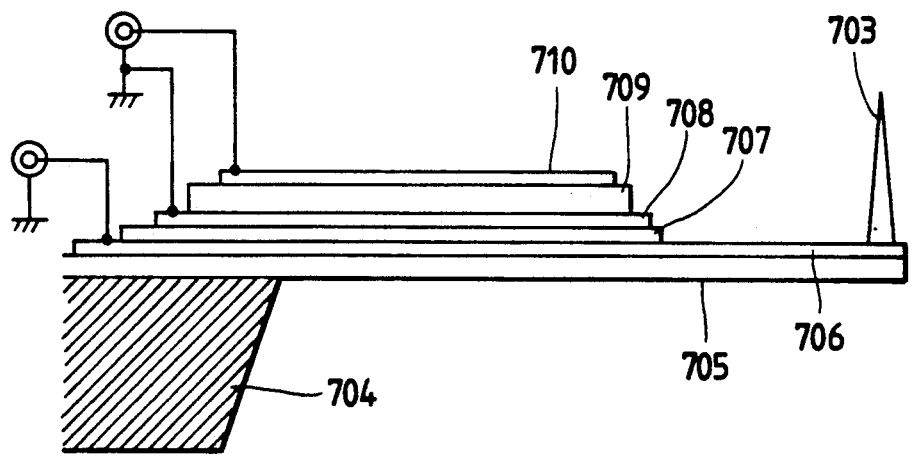
Figure 8:
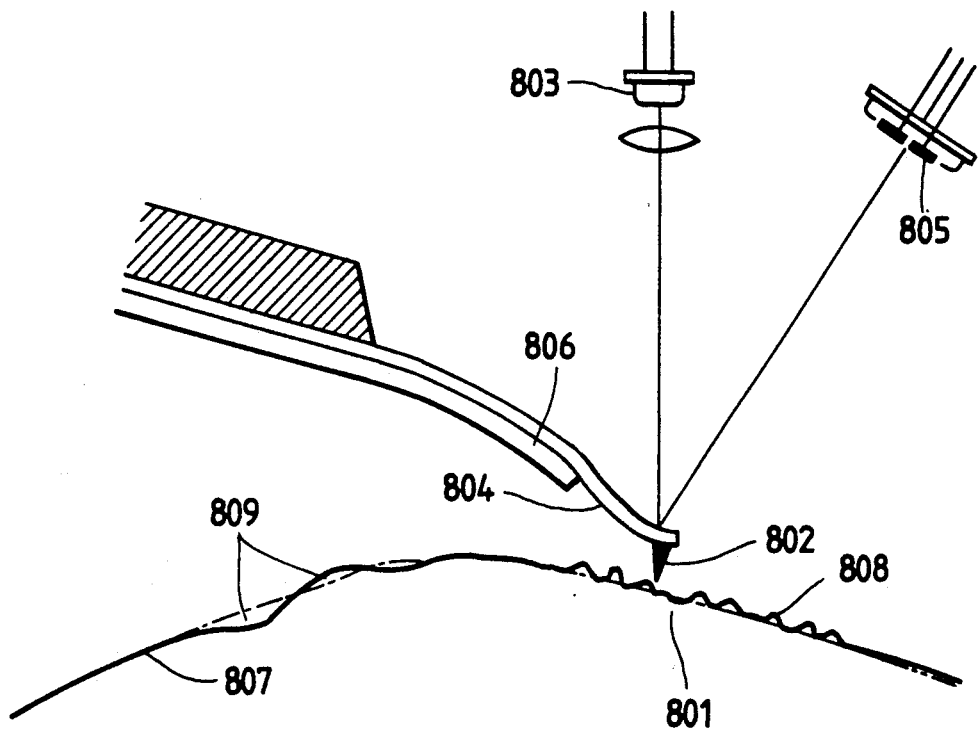
FIG. 8 is an illustration of the information processing device having the micro-displacement type information detection probe device according to the fifth embodiment of the present invention.

FIGS. 7A and 7B and FIG. 8 show the fifth embodiment. In the present embodiment, the micro-displacement type information detection device consists of the two stages of the cantilever portion 701 equipped with actuator and the micro-cantilever portion 702, and a probe 703 for recording signal application and reproduction signal detection is mounted at the tip of the micro-cantilever portion 702. As to the details of the micro-displacement type information detection probe device, as shown in FIG. 7B, on the $Si_3N_4$ layer 705 constituting the two stage cantilever provided on the Si substrate 704 is provided an Au wiring 706 for application of recording signals on the probe 703, and further as the upper layers thereon, an $Si_3N_4$ layer 707 as the insulation layer, the portion constituting the first stage cantilever comprising the three layers of an Au layer 708 constituting the unimorph device actuator, a ZnO layer 709 and an Au layer 710 are provided.

The preparation steps of such device are substantially the same as the method described in the Embodiment 1, and after formation of $Si_3N_4$ on the Si (100) substrate according to the CVD method to a film thickness of 0.5 $\mu$m, Au wiring is formed thereon to a film thickness of 0.1 $\mu$m according to the sputtering method. Here, after patterning to the second stage cantilever shape by photolithographic steps, an $Si_3N_4$ layer is formed again to 0.1 $\mu$m on the first stage cantilever portion according to the CVD method, and while repeating patterning, Au layer 0.1 $\mu$m, ZnO layer 0.3 $\mu$m, An layer 0.1 $\mu$m are formed. Then, according to the electron beam deposition method, an electroconductive material such as carbon, etc. is vapor deposited on the tip of the second stage cantilever portion, followed finally by formation of the cantilever according to anisotropic etching with KOH from the back of the substrate.

The sizes of the cantilevers of the micro-displacement type information detection probe device prepared according to the above steps were the rectangular type with a width of 150 $\mu$m and a length of 600 $\mu$m for the cantilever portion equipped with actuator and V type with a width of 20 $\mu$m and a length of 100 $\mu$m for the micro-cantilever portion.

Next, by use of FIG. 8, description is made about an embodiment in which the micro-displacement type information detection probe device of the present embodiment is applied to an information processing device capable of performing recording and reproduction. By approaching the probe 802 with the tip end to a distance of 1 nanometer or less to the recording medium substrate 801, scanning is performed relatively in the lateral direction. Here, the light beam from the laser 803 is irradiated on the back at the tip end of the micro-cantilever supporting the probe 802, and the reflected light beam spot position is detected by a bi-divided sensor 805. When a change occurs in size of the atomic force acting between the recording medium substrate 801 and the probe 802, the warped amount of the micro-cantilever portion changes to accompany angular change of the reflected light beam, whereby a change occurs in the beam spot position on the bi-divided sensor 805. Accordingly, so that the beam spot position may become constant, namely the size of the atomic force acting between the recording medium substrate 801 and the probe 802 may be constant, the warp displacement amount of the cantilever portion 806 equipped with actuator is controlled. From the size of the control signal, the control amount of vertical movement of the probe 802 to make the size of atomic force constant, namely the shape of the surface of the recording medium substrate 801 can be detected. At this time, the resonance frequency to the warp displacement of the cantilever portion 806 equipped with actuator is about 1 kHz, but the resonance frequency to the warp of the micro-cantilever portion 804 becomes about 50 kHz, and therefore the probe 802 can be scanned on the substrate surface through the warp displacement of the cantilever portion 806 equipped with actuator for large undulation, slope 807 on the micron order of the recording medium substrate 801 surface, and through the warp of the micro-cantilever portion 804 for the recording bit 808 on the nanometer order, the unevenness 809 of the substrate. Thus, by actuating independently the cantilever portion 806 equipped with the actuator and the micro-cantilever portion 804, high speed scanning becomes possible, whereby the access speed of the information processing device of the present embodiment could be improved.

Here, the method of recording and reproduction is described. As the recording medium substrate 801, for example, one having electroconductivity such as Au (111) plane epitaxially grown on mica and being flat on the subnanometer order over wide range is used. By approaching the probe to the substrate as described above, and applying a pulse voltage of 5 V, 100 μs therebetween, bits with convex shape having diameters of about 10 nm can be formed. As the recording method, other than the examples mentioned here, any of the methods which change the surface shape of the recording medium substrate may be employed, and other materials may be available and bits with concave shape may be also formed. As the reproduction method, when the probe approaches the recording bit, the warp amount due to the atomic force therebetween of the micro-cantilever supporting the probe is detected by the positional deviation amount of the reflected light beam spot on the bi-divided sensor, and this is made the reproduction signal. Such reproduction is rendered possible, because the cantilever portion equipped with an actuator will not follow the signals of high frequency such as recording bit, etc.

As described above, the micro-displacement type information detection probe device of the present invention utilizes the reverse piezoelectric effect, and also can realize enlargement of the warping displacement amount by forming cantilevers of multiple stages within the plane of the cantilever or on the extension from the tip end of the cantilever.

When the micro-displacement type information detection probe device of the present invention is mounted in a scanning tunneling microscope, an atomic force microscope or an information processing device for performing recording and reproduction of high density, provision of the cantilever in multiple stages enables separate actuation of the functions, whereby the access speed can be improved as compared with the prior art to provide a highly stable and high speed scanning tunneling microscope, an atomic force microscope or information processing device.

What is claimed is:

1. A micro-displacement type information detection device, comprising:
   a substrate;
   a first cantilever having one end supported on said substrate;
   a second cantilever having one end supported on a second end of said first cantilever, said first and second cantilevers being formed in a same plane and having a same layer structure comprising a piezoelectric material sandwiched between a pair of electrodes; and
   a probe provided on a second end of said second cantilever, wherein
   at least one of said pair of electrodes is divided into at least two pieces along the longitudinal direction thereof and said pair of electrodes are adapted to apply different voltages including a voltage in a reverse direction to portions of said piezoelectric material corresponding to the at least two pieces to displace said first cantilever by a reverse piezoelectric effect.

2. A micro-displacement type information detection device according to claim 1, wherein said second cantilever is surrounded by said first cantilever in a reverse direction.

3. A micro-displacement type information detection device according to claim 1, wherein a plurality of second cantilevers are juxtaposed.

4. A micro-displacement type information detection device, comprising:
   a substrate;
   a first cantilever having one end supported on said substrate;
   a second cantilever having one end supported on a second end of said first cantilever;
   a third cantilever having one end supported on a second end of said second cantilever, said first to third cantilevers being formed in a same plane and having a same layer structure comprising a piezoelectric material sandwiched between a pair of electrodes; and
   a probe provided on a second end of said third cantilever, wherein
   at least one of said pair of electrodes of said first and second cantilevers is divided into at least two pieces along the longitudinal direction thereof and said pair of electrodes are adapted to apply different voltages including a voltage in a reverse direction to portions of said piezoelectric material corresponding to the at least two pieces to displace said first and second cantilevers by a reverse piezoelectric effect.

5. An information processing apparatus, comprising:

a micro-displacement type probe device comprising a substrate, a first cantilever having one end supported on said substrate, a second cantilever having one end supported on a second end of said first cantilever, said first and second cantilevers being formed of elastic structures having different resonance frequencies, said first cantilever comprising a piezoelectric material sandwiched between a pair of electrodes, and a probe provided on a second end of said second cantilever;

a recording medium opposed to said probe of said micro-displacement type probe device;

means for applying a voltage for recording information between said probe and said recording medium; and means for detecting the displacement of said probe, wherein a displacement signal outputted from said means for detecting the displacement of said probe is processed to extract a lower frequency component than the resonance frequency of said first cantilever, and said first cantilever is deformed by applying voltages to said pair of electrodes so as to compensate the displacement amount corresponding to the lower frequency component.

6. An information processing apparatus, comprising:

a micro-displacement type probe device comprising a substrate, a first cantilever having one end supported on said substrate, a second cantilever having one end supported on a second end of said first cantilever, said first and second cantilevers being formed of elastic structures having different resonance frequencies, said first cantilever comprising a piezoelectric material sandwiched between a pair of electrodes, and a probe provided on a second end of said second cantilever;

a recording medium opposed to said probe of said micro-displacement type probe device; and means for detecting displacement of said probe, wherein a displacement signal outputted from said means for detecting the displacement of said probe is processed to extract a lower frequency component than the resonance frequency of said first cantilever, and said first cantilever is deformed by applying voltages to the pair of electrodes so as to compensate the displacement amount corresponding to the lower frequency component, and wherein the displacement signal outputted from said means for detecting the displacement of said probe is processed to extract a higher frequency component than the resonance frequency of said first cantilever, and information is reproduced from the higher frequency component.

* * * * *

UNITED STATES PATENT AND TRADEMARK OFFICE
CERTIFICATE OF CORRECTION

PATENT NO. : 5,276,672
DATED : January 4, 1994
INVENTOR(S) : Miyazaki et al.

It is certified that error appears in the above-indentified patent and that said Letters Patent is hereby corrected as shown below:

TITLE PAGE

[57] ABSTRACT:

Line 9, "lalyer" should read --layer--.

Signed and Sealed this

Fourth Day of October, 1994

Attest:

BRUCE LEHMAN

Attesting Officer    Commissioner of Patents and Trademarks